US009236871B1

(12) United States Patent
Hu et al.

(10) Patent No.: US 9,236,871 B1
(45) Date of Patent: Jan. 12, 2016

(54) DIGITAL FILTER FOR PHASE-LOCKED LOOP INTEGRATED CIRCUITS

(71) Applicant: Integrated Device Technology, Inc., San Jose, CA (US)

(72) Inventors: Pengfei Hu, Chandler, AZ (US); Brian Buell, Gilbert, AZ (US)

(73) Assignee: Integrated Device Technology, inc., San Jose, CA (US)

( * ) Notice: Subject to any disclaimer, the term of this patent is extended or adjusted under 35 U.S.C. 154(b) by 0 days.

(21) Appl. No.: 14/460,653

(22) Filed: Aug. 15, 2014

(51) Int. Cl.
H03L 7/06 (2006.01)
H03L 7/093 (2006.01)
H03M 3/00 (2006.01)

(52) U.S. Cl.
CPC .............. *H03L 7/093* (2013.01); *H03M 3/464* (2013.01)

(58) Field of Classification Search
CPC .............. H03H 11/04; H03H 11/1217; H03H 11/1291; H03H 10/004; A61N 1/37247; H01L 2924/00; H04B 1/0475
See application file for complete search history.

(56) References Cited

U.S. PATENT DOCUMENTS

| 6,765,445 | B2 | 7/2004 | Perrott et al. | |
|---|---|---|---|---|
| 7,027,786 | B1 * | 4/2006 | Smith et al. | 455/139 |
| 7,573,303 | B1 * | 8/2009 | Chi et al. | 327/105 |
| 2004/0198290 | A1 * | 10/2004 | Chien | 455/260 |
| 2008/0042708 | A1 * | 2/2008 | Kimura et al. | 327/159 |
| 2010/0309162 | A1 * | 12/2010 | Nakanishi et al. | 345/174 |
| 2012/0062288 | A1 * | 3/2012 | Belot et al. | 327/156 |
| 2013/0106484 | A1 * | 5/2013 | Cyrusian | 327/331 |

OTHER PUBLICATIONS

Cha et al., "A Phase-Locked Loop with Embedded Analog-to-Digital Converter for Digital Control", ETRI Journal, Aug. 2007, pp. 463-469, vol. 29, No. 4.
Harrison et al., "A multi-bit sigma-delta ADC with an FIR DAC loop filter", Department of Electronics, Macquarie University, Marsfield 2109 Australia, 6 pages.
"FemtoClock® NG Universal Frequency Translator", IDT8T49N222I, Integrated Device Technology, Inc., Data Sheet, May 13, 2013, © 2013, 40 pages.

* cited by examiner

*Primary Examiner* — Sibin Chen
(74) *Attorney, Agent, or Firm* — Myers, Bigel, et al.

(57) ABSTRACT

A digital filter for a frequency synthesizer (e.g., PLL, UFT) may include an analog-to-digital (ADC) converter, which is responsive to a control voltage at an input thereof, and a digital-to-analog (DAC) converter, which has an input responsive to a signal generated at an output of the ADC. An impedance element is provided between the DAC and ADC. The impedance element has real and reactive components, a first current carrying terminal electrically coupled to an output of the DAC and a second current carrying terminal electrically coupled to the input of the ADC. The impedance element can include a resistor and a capacitor, which are electrically connected in parallel. A gain device, such as a programmable multiplier, may also be provided, which has an input responsive to the signal generated at the output of the ADC and an output electrically coupled to the input of the DAC.

21 Claims, 5 Drawing Sheets

DIGITAL FILTER FOR PHASE-LOCKED LOOP INTEGRATED CIRCUITS

FIELD OF THE INVENTION

The present invention relates to integrated circuit devices and systems and, more particularly, to integrated circuit devices and systems that utilize clocks to synchronize timing of operations therein.

BACKGROUND OF THE INVENTION

Frequency references provided by oscillators are required in every clocked electronic system, including communication circuits, microprocessors, and signal processing circuits. Often, an integrated charge pump phase-locked loop (PLL) is used to generate a high frequency clock with a highly stable frequency from a somewhat lower frequency reference clock provided by an oscillator. As will be understood by those skilled in the art, to maintain loop stability within a PLL, the zero produced by the combination of the resistor R and capacitor C in the loop filter of the PLL should be as small as $\frac{1}{5}^{th}$ or so of the open loop bandwidth, which means the capacitor C is typically very large and may occupy a considerable amount of die area, especially when the bandwidth of the PLL needs to be relatively small.

One example of a PLL that replaces the integrating function of a loop filter capacitor with a digital implementation is disclosed in U.S. Pat. No. 6,765,445 to Perrott et al., entitled "Digitally-Synthesized Loop Filter Circuit Particularly Useful for a Phase Locked Loop." In Perrott et al., a phase error output signal of an analog phase detector is delta-sigma modulated to encode the magnitude of a phase error using a digital (i.e., discrete-time and discrete-value) signal. This digital phase error signal is "integrated" by a digital integration block including, for example, a digital accumulator whose output is converted to an analog signal using a digital-to-analog converter (DAC). The equivalent "size" of the integrating capacitor function provided by the digital integration block may be varied by increasing or decreasing the bit resolution of circuits within the digital block. Another example of a PLL that utilizes an embedded analog-to-digital (ADC) converter is disclosed at FIG. 3 of an article by S. Cha et al., entitled "A Phase-Locked Loop with Embedded Analog-to-Digital Converter for Digital Control," ETRI Journal, Vol. 29, No. 4, pp. 463-469, August (2007).

SUMMARY OF INVENTION

Phase-locked loop integrated circuits according to some embodiments of the invention include an analog-to-digital (ADC) converter, which is responsive to a control voltage at an input thereof. A digital-to-analog (DAC) converter is also provided, which has an input responsive to a signal generated at an output of the ADC. In addition, an impedance element is provided between the DAC and ADC. The impedance element has real and reactive components, a first current carrying terminal electrically coupled to an output of the DAC and a second current carrying terminal electrically coupled to the input of the ADC.

According to some of these embodiments of the invention, the impedance element includes a resistor and a capacitor, which are electrically connected in parallel. Advantageously, the capacitor may be small with a magnitude of less than about 500 pF. A charge pump may also be provided to generate the control voltage.

According to still further embodiments of the invention, a gain device such as a programmable multiplier may be provided, which has an input responsive to the signal generated at the output of the ADC and an output electrically coupled to the input of the DAC. A divider (e.g., fractional-N divider) may also be provided, which is responsive to the signal generated at the output of the ADC.

According to further embodiments of the invention, an integrated circuit may be provided, which includes a charge pump configured to generate a control voltage, and a digital filter. This digital filter includes an analog-to-digital (ADC) converter, which is responsive to the control voltage at an input thereof, and a digital-to-analog (DAC) converter having an input responsive to a signal generated at an output of the ADC. An impedance element is also provided, which has real and reactive components. The impedance element has a first current carrying terminal electrically coupled to an output of the DAC and a second current carrying terminal electrically coupled to the input of the ADC. The impedance element may consists essentially of a resistor and a capacitor electrically connected in parallel. A magnitude of the capacitor can be less than about 500 pF.

According to some further embodiments of the invention, a phase-locked loop (PLL) integrated circuit is provided, which includes a charge pump configured to generate a control voltage ($V_{CNTL}$) and a digital filter. The digital filter includes an analog-to-digital (ADC) converter, which is responsive to the control voltage $V_{CNTL}$ at an input thereof, and a digital-to-analog (DAC) converter having an input responsive to a signal generated at an output of the ADC. An impedance element is also provided within the filter. The impedance element has real and reactive components, a first current carrying terminal electrically coupled to an output of the DAC and a second current carrying terminal electrically coupled to the input of the ADC. The PLL further includes a voltage controlled oscillator (VCO) responsive to the control voltage $V_{CNTL}$ and a phase-frequency detector (PFD) configured to drive the charge pump with UP and DOWN control signals in response to a reference clock (REF_CLK) and a feedback clock (FB_CLK). A divider is also provided, which is responsive to a clock generated at an output of the VCO. The divider is configured to drive an input of the PFD with the feedback clock. According to additional aspects of these embodiments of the invention, the impedance element includes a resistor and a capacitor electrically connected in parallel. A magnitude of the capacitor can be less than about 500 pF.

DETAILED DESCRIPTION OF EMBODIMENTS

Figure 1:
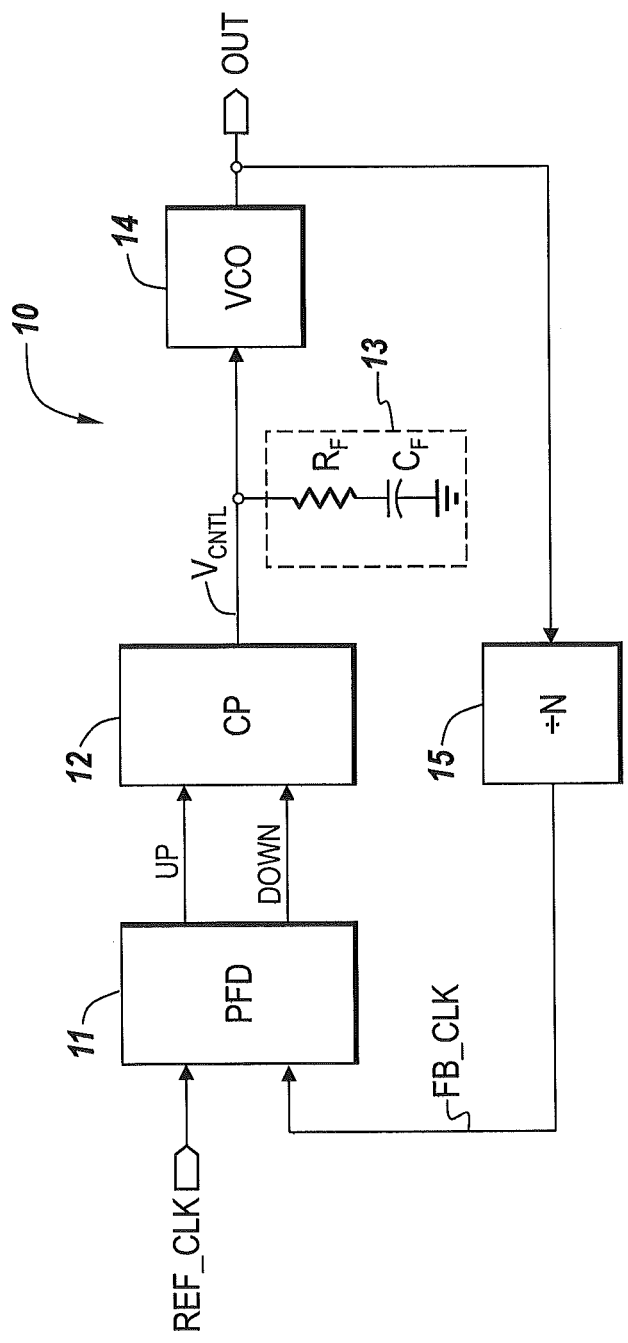
FIG. 1 is an block diagram of a conventional phase-locked loop (PLL) integrated circuit.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring now to FIG. 1, a conventional phase-locked loop (PLL) integrated circuit 10 is illustrated as including a phase-frequency detector (PFD or PD) 11, a charge pump (CP) 12, an RC loop filter 13, a voltage-controlled oscillator (VCO) 14 and a divide-by-N feedback divider 15. As shown, the phase-frequency detector 11 generates UP and DOWN control signals to the charge pump 12 in response to a comparison of a relative phase offset between a reference clock (REF_CLK) and feedback clock (FB_CLK) generated by the feedback divider 15. The charge pump 12 generates an analog control signal ($V_{CNTL}$), which is provided as an input to the voltage-controlled oscillator 14 after being filtered by the RC loop filter 13. As will be understood by those skilled in the art, to maintain loop stability within the PLL 10, the zero produced by the combination of the resistor $R_F$ and capacitor $C_F$ in the loop filter 13 should be as small as $\frac{1}{5}^{th}$ or so of the open loop bandwidth, which means the capacitor $C_F$ is typically very large and may occupy a considerable amount of die area, especially when the bandwidth of the PLL 10 needs to be relatively small.

Figure 2A:
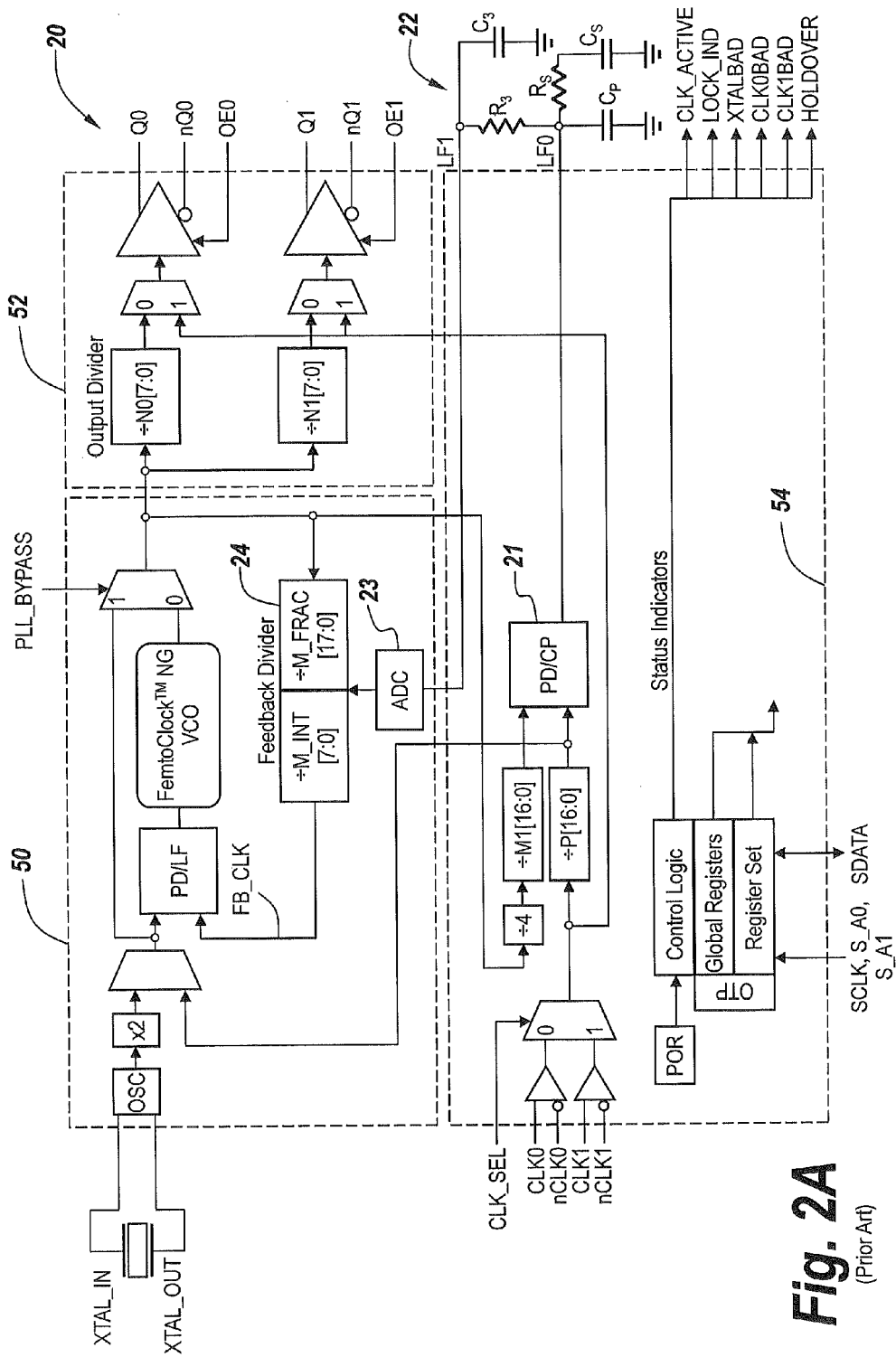
FIG. 2A is a block diagram of a frequency translator/synthesizer according to the prior art.
Figure 2B:
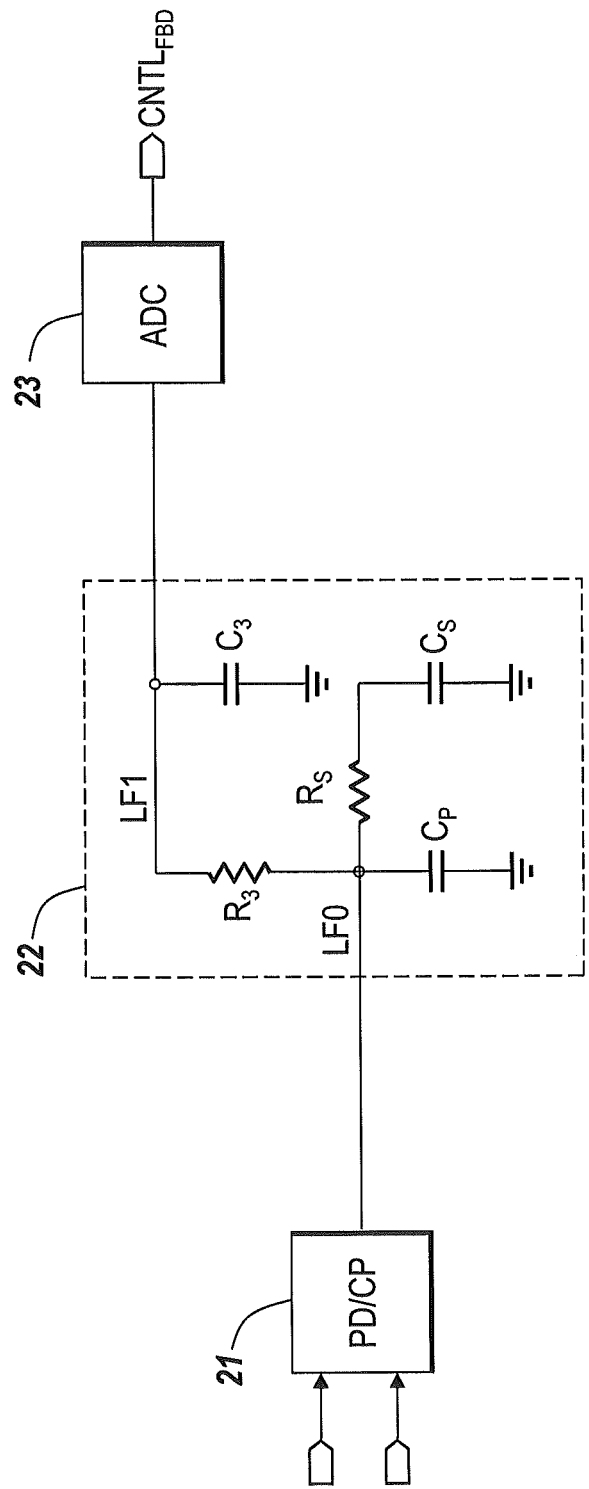
FIG. 2B is an electrical schematic showing a portion of the frequency translator of FIG. 2A.

A variation on this RC loop filter 13 of FIG. 1 may be utilized within a more complex frequency translator/synthesizer, such as the FemtoClock® NG Universal Frequency Translator (UFT) 20 of FIGS. 2A-2B. This UFT, which is manufactured by Integrated Device Technology, Inc., the assignee of the present application, is more fully disclosed in a publicly available datasheet; IDT8T49N22I, Revision A, May 13, 2013, which is hereby incorporated herein by reference. As shown by FIGS. 2A-2B and described in this datasheet, this conventional UFT 20 includes a frequency synthesizer 50 with an upper feedback loop, which is responsive to a typically external crystal oscillator (XTAL) reference signal and an output divider circuit 52. A translator mode logic and control circuit 54 is also provided, which is electrically coupled (e.g., off chip) to a typically external RC loop filter 22, which is defined by resistors $R_3$ and $R_S$ and capacitors $C_P$, $C_S$ and $C_3$ as illustrated. As will be understood by those skilled in the art, this UFT 20 is configured to support at least three distinct modes of operation, including: (i) a frequency synthesizer mode; (ii) a high-bandwidth frequency translator mode; and (iii) a low-bandwidth frequency translator mode. In the frequency synthesizer mode, an output frequency can be generated from a fundamental mode crystal input. In this mode, only the upper feedback loop within the frequency synthesizer 50 is used, with the clock signals CLK0 and CLK1 being unused. The upper feedback loop supports a delta-sigma fractional feedback divider 24, which allows the VCO operating frequency to be a non-integer multiple of the crystal frequency. During this mode, the illustrated components of the translator mode logic and control circuit 54 remain inactive.

In the high-bandwidth frequency translator mode, one of two input clocks (e.g., CLK0, CLK1) of equivalent nominal frequency is translated into an output frequency with relatively little jitter attenuation. Like the frequency synthesizer mode, only the upper feedback loop is used, however, it is responsive to an output of the pre-divider (÷P[16:0]) and not the crystal oscillator XTAL. Moreover, neither the phase detector/charge pump (PD/CP) 21, integer divider (÷M1[16:0]), nor the RC loop filter 22 are active during the high-bandwidth frequency translator mode. As will be understood by those skilled in the art, the pre-divider (÷P[16:0]) is preferably used to maintain the operating frequencies at the phase dectector/loop filter (PD/LF), which is located within the frequency synthesizer 50, at a relatively low level (e.g., <100 MHz).

Finally, in the low-bandwidth frequency translator mode, two PLL loops are used including a lower PLL loop, which utilizes components within the translator mode logic and control circuit 54. This lower PLL loop with large integer dividers, which is the low bandwidth loop, sets the output-to-input frequency translation ratio and drives the upper digitally controlled crystal oscillator (DCXO) loop via an analog-to-digital converter (ADC) 23, which as illustrated more fully by FIG. 2B includes the RC loop filter 22. As shown in FIGS. 2A-2B, the phase detector/charge pump 21 drives an input node (LF0) of the loop filter 22. An output node (LF1) of the loop filter 22 is electrically coupled to an input of the analog-to-digital converter 23, which drives the feedback divider 24 within the upper loop with a control signal $CNTL_{FBD}$. In addition, the pre-divider (÷P[16:0]) is used to scale down the input frequency by an integer value, which enables the UFT 20 to accept a relatively large range of input frequencies. By dividing down the fed-back VCO operating frequency by the integer divider ÷M1[16:0] to as close as possible to the same frequency as the output of the pre-divider ÷P[16:0], highly accurate frequency translations can be achieved.

Figure 3A:
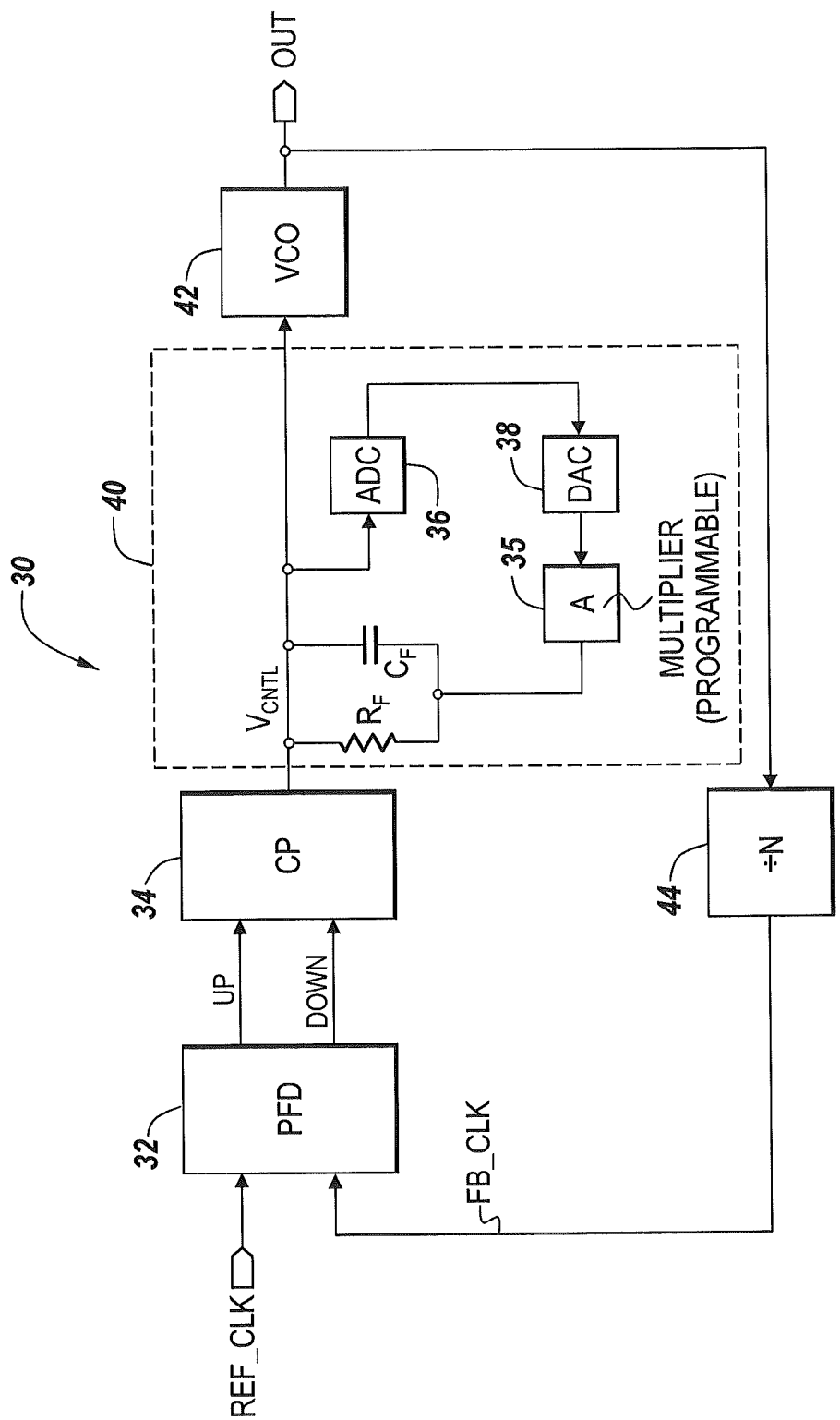
FIG. 3A is block diagram of a phase-locked loop (PLL) integrated circuit according to an embodiment of the present invention.

FIG. 3A illustrates a block diagram of a phase-locked loop (PLL) integrated circuit 30 according to an embodiment of the present invention. The PLL 30 includes a charge pump (CP) 34, which is configured to generate a control voltage $V_{CNTL}$, and a digital filter 40 according to an embodiment of the present invention. As illustrated, this digital filter 40 can include an analog-to-digital converter (ADC) 36, which is responsive to the control voltage $V_{CNTL}$, a digital-to-analog (DAC) converter 38 having an input responsive to a signal generated at an output of the ADC 36, and an impedance element having real and reactive components (e.g., Z=R+jX, where the real and reactive components of Z (i.e., R and X) are derived from $R_F$ and $C_F$, as shown in the illustrated embodiment). As will be understood by those skilled in the art, even if the ADC 36 and DAC 38 are treated as entirely ideal devices, an analog signal generated at an output of the DAC 38 can be treated as a delayed version of the control voltage $V_{CNTL}$, which is being fed back to a terminal of the impedance element.

As shown, this impedance element Z may be configured as a filter resistor $R_F$ in parallel with a filter capacitor $C_F$, however, other embodiments of an impedance element may also be used. According to some embodiments of the invention, the filter capacitor, which is preferably an on-chip capacitor, may have a relatively small value in a range from about 100 pf to about 500 pF, for example. A first current carrying terminal of the impedance element is electrically coupled and/or responsive to a signal generated at an output of the DAC 38, either directly or indirectly through a signal multiplier 35 (e.g., analog gain device (gain=A)), which may be optional and may influence the size of the capacitor $C_F$ needed within the impedance element. According to other embodiments of the invention, the signal multiplier 35 may take the form of a digital multiplier with programmable gain, which is located between the ADC 36 and the DAC 38. The impedance element also includes a second current carrying terminal, which is electrically coupled to the input of the ADC 36 and directly to an output of the charge pump 34, as illustrated. This second current carrying terminal receives the current analog value of $V_{CNTL}$. These aspects of the digital filter 40 of FIG. 3A may also apply to the digital filter 40' of FIG. 3B, described hereinbelow.

The PLL 30 of FIG. 3A also includes a voltage controlled oscillator (VCO) 42, which is responsive to the control voltage $V_{CNTL}$. As illustrated, this VCO may be configured to generate an output signal (OUT) directly or via an output divider circuit (see, e.g., output driver 52 in FIG. 2A). FIG. 3A also illustrates a phase-frequency detector (PFD) 32, which is configured to drive the charge pump 34 with up and down control signals (UP, DOWN) in response to a reference clock (REF_CLK) and a feedback clock (FB_CLK). This feedback clock FB_CLK is generated by a divider 44, which is responsive to a signal (e.g., clock) generated at an output of the VCO 42.

Figure 3B:
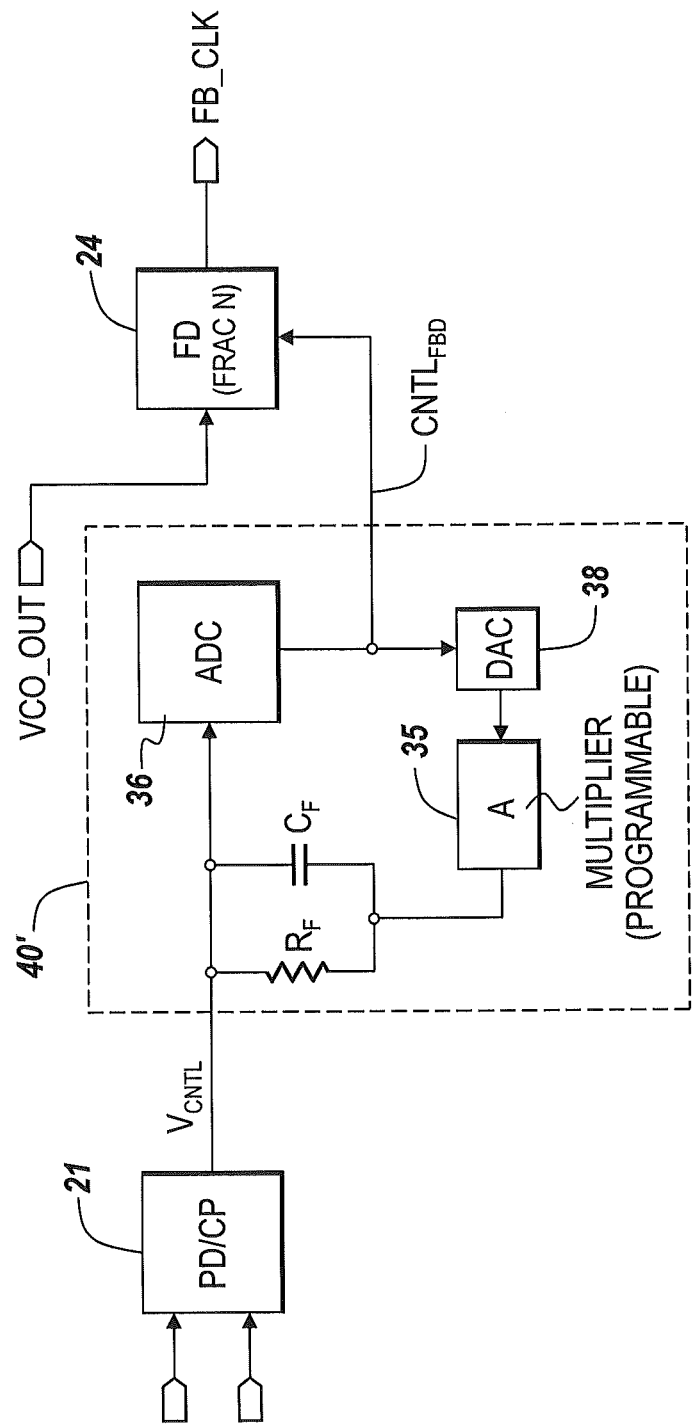
FIG. 3B is a block diagram highlighting a digital filter according to an embodiment of the present invention. The elements of FIG. 3B can be used to replace the corresponding phase detector/charge pump (PD), RC loop filter, analog-to-digital converter (ADC) and fractional_N feedback divider illustrated by FIGS. 2A-2B.

According to still further embodiments of the invention, as illustrated by FIG. 3B, the digital filter 40 of FIG. 3A may also be used in the universal frequency translator/synthesizer of FIGS. 2A-2B. As shown, the RC loop filter 22 and ADC 23 of FIGS. 2A-2B may be replaced by the digital filter 40' of FIG. 3B, where the control signal $CNTL_{FBD}$ is provided to the feedback divider 24 (e.g., fractional-N divider), which also receives a relatively high frequency signal VCO_OUT from the voltage-controlled oscillator (VCO) in the upper loop. According to embodiments of the invention, the digital filter 40' can include an analog-to-digital (ADC) converter 36, which is responsive to a control voltage $V_{CNTL}$ generated by a phase detector/charge pump 21, a digital-to-analog (DAC) converter 38 having an input responsive to a signal generated at an output of the ADC 36, and an impedance element having real and reactive components (e.g., $Z=R_F+jX$, where $X=1/j\omega C_F$). As shown, this impedance element, which may be configured as a filter resistor $R_F$ in parallel with a filter capacitor $C_F$, has a first current carrying terminal electrically coupled and/or responsive to a signal generated at an output of the DAC 38, either directly from the output of the DAC 38 or indirectly through a signal multiplier 35 (e.g., analog gain device (gain=A) or digital multiplier with programmable gain), if present between the DAC 38 and the impedance element Z.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A phase-locked loop integrated circuit, comprising:
   an analog-to-digital converter (ADC) responsive to a control voltage at an input thereof;
   a digital-to-analog converter (DAC) having an input responsive to an ADC output signal generated at an output of said ADC, said DAC input directly receiving a digital signal that retains all material digital information contained in the ADC output signal; and
   an impedance element having real and reactive components, a first current carrying terminal electrically coupled to an output of said DAC and a second current carrying terminal electrically shorted to the input of said ADC, said first current carrying terminal directly receiving an analog signal that retains all material analog information contained in a DAC output signal generated at the output of said DAC.

2. The phase-locked loop integrated circuit of claim 1, wherein said impedance element comprises a resistor and a capacitor electrically connected in parallel.

3. The phase-locked loop integrated circuit of claim 2, wherein a magnitude of the capacitor is in a range from about 100 pF to about 500 pF.

4. The phase-locked loop integrated circuit of claim 1, further comprising a charge pump configured to generate the control voltage.

5. The phase-locked loop integrated circuit of claim 1, further comprising a programmable multiplier having an input responsive to the signal generated at the output of said ADC and an output electrically coupled to the input of said DAC.

6. The phase-locked loop integrated circuit of claim 1, further comprising a divider responsive to the signal generated at the output of said ADC.

7. An integrated circuit, comprising:
a charge pump configured to generate a control voltage; and
a digital filter, comprising:
an analog-to-digital converter (ADC) responsive to the control voltage at an input thereof;
a digital-to-analog converter (DAC) having an input electrically shorted to an output of said ADC; and
an impedance element having real and reactive components, a first current carrying terminal electrically coupled to an output of said DAC and a second current carrying terminal electrically shorted to the input of said ADC, said first current carrying terminal directly receiving an analog signal that retains all material analog information contained in a DAC output signal generated at the output of said DAC.

8. The integrated circuit of claim 7, wherein said impedance element consists essentially of a resistor and a capacitor electrically connected in parallel; and wherein a magnitude of the capacitor is in a range from about 100 pF to about 500 pF.

9. A phase-locked loop integrated circuit, comprising:
a charge pump configured to generate a control voltage at an output thereof;
a digital filter, comprising:
an analog-to-digital converter (ADC) responsive to the control voltage at an input thereof;
a digital-to-analog converter (DAC) having an input responsive to an ADC output signal generated at an output of said ADC, said DAC input directly receiving a digital signal that retains all material digital information contained in the ADC output signal; and
an impedance element having real and reactive components, a first current carrying terminal electrically coupled to an output of said DAC and a second current carrying terminal electrically shorted to the input of said ADC and electrically shorted to the output of said charge pump, said first current carrying terminal directly receiving an analog signal that retains all material analog information contained in a DAC output signal generated at the output of said DAC; and
a voltage controlled oscillator (VCO) responsive to the control voltage.

10. The phase-locked loop integrated circuit of claim 9, further comprising a phase-frequency detector (PFD) configured to drive said charge pump with up and down control signals in response to a reference clock and a feedback clock; and wherein an input of said VCO is electrically shorted to the second current carrying terminal of said impedance element.

11. The phase-locked loop integrated circuit of claim 10, further comprising a divider responsive to a clock generated at an output of said VCO, said divider configured to drive an input of said PFD with the feedback clock.

12. The phase-locked loop integrated circuit of claim 9, wherein said impedance element comprises a resistor and a capacitor electrically connected in parallel.

13. The phase-locked loop integrated circuit of claim 12, wherein a magnitude of the capacitor is in a range from about 100 pF to about 500 pF.

14. An integrated circuit device, comprising:
a universal frequency translator (UFT) configured to support at least three modes of operation including a frequency synthesizer mode, a high-bandwidth frequency translator mode and a low-bandwidth frequency translator mode, said UFT having a digital filter therein comprising:
an analog-to-digital converter (ADC) responsive to a control voltage at an input thereof;
a digital-to-analog converter (DAC) having an input responsive to an ADC output signal generated at an output of said ADC, said DAC input directly receiving a digital signal that retains all material digital information contained in the ADC output signal; and
an impedance element having real and reactive components, a first current carrying terminal electrically coupled to an output of said DAC and a second current carrying terminal electrically shorted to the input of said ADC, said first current carrying terminal directly receiving an analog signal that retains all material analog information contained in a DAC output signal generated at the output of said DAC.

15. The integrated circuit device of claim 14, wherein said impedance element comprises a resistor and a capacitor electrically connected in parallel; and wherein a magnitude of the capacitor is in a range from about 100 pF to about 500 pF.

16. The integrated circuit device of claim 14, further comprising a fractional-N divider within an upper phase-locked loop (PLL) of the UFT, said divider responsive to a signal generated at the output of said ADC.

17. The integrated circuit device of claim 14, further comprising a fractional-N divider within an upper phase-locked loop (PLL) of the UFT, said divider having an input electrically shorted to the output of said ADC and the input of said DAC.

18. The integrated circuit of claim 1, wherein during operation of the phase-locked loop integrated circuit, a total current through said impedance element is equivalent to $(V_1 - V_{CNTL})/Z$, where $V_1$ designates a voltage at the first current carrying terminal of said impedance element, $V_{CNTL}$ designates the control voltage at the second current carrying terminal of said impedance element and $Z=R+jX$, where R designates a resistance of said impedance element and X designates a reactance of said impedance element.

19. The integrated circuit of claim 7, wherein during operation of said digital filter, a total current through said impedance element is equivalent to $(V_1 - V_{CNTL})/Z$, where $V_1$ designates a voltage at the first current carrying terminal of said impedance element, $V_{CNTL}$ designates the control voltage at the second current carrying terminal of said impedance element and $Z=R+jX$, where R designates a resistance of said impedance element and X designates a reactance of said impedance element.

20. The integrated circuit of claim 9, wherein during operation of said digital filter, a total current through said impedance element is equivalent to $(V_1 - V_{CNTL})/Z$, where $V_1$ designates a voltage at the first current carrying terminal of said impedance element, $V_{CNTL}$ designates the control voltage at the second current carrying terminal of said impedance element and $Z=R+jX$, where R designates a resistance of said impedance element and X designates a reactance of said impedance element.

21. The integrated circuit device of claim 14, wherein during operation of said UFT, a total current through said impedance element is equivalent to $(V_1 - V_{CNTL})/Z$, where $V_1$ designates a voltage at the first current carrying terminal of said impedance element, $V_{CNTL}$ designates the control voltage at the second current carrying terminal of said impedance element and $Z=R+jX$, where R designates a resistance of said impedance element and X designates a reactance of said impedance element.

* * * * *